Jan. 28, 1969 L. J. VAN RUYVEN 3,424,890
METHOD OF BONDING TWO DIFFERENT MATERIALS
BY ELECTRO-MAGNETIC RADIATION
Filed Oct. 28, 1965
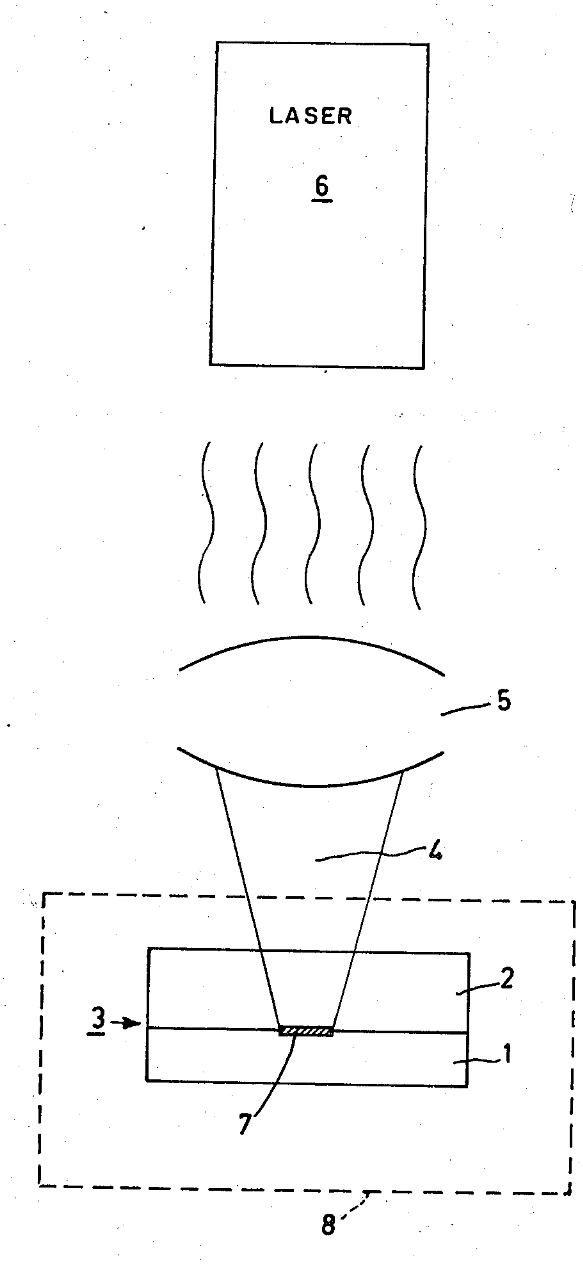
INVENTOR.
LODEWIJK J. VAN RUYVEN
BY
Frank R. Trifari
AGENT

United States Patent Office 3,424,890
Patented Jan. 28, 1969

3,424,890
METHOD OF BONDING TWO DIFFERENT MATERIALS BY ELECTRO-MAGNETIC RADIATION

Lodewijk J. Van Ruyven, Newark, Del., assignor to North American Philips Company Inc., New York, N.Y., a corporation of Delaware Filed Oct. 28, 1965, Ser. No. 505,541
Claims priority, application Netherlands, Nov. 19, 1964, 6413441
U.S. Cl. 219—121 10 Claims
Int. Cl. B23k 9/00

ABSTRACT OF THE DISCLOSURE

First and second body portions of different semi-conductor materials are bonded together by interfacial fusion as electromagnetic radiation is generated therethrough. The first body portion has a relatively high absorption constant for electromagnetic radiation in a narrow spectral range and the second body portion has a relatively lower absorption constant for the same electromagnetic radiation in the same narrow spectral range. During the time the body portions are irradiated, such body portions are arranged in anyone of a vacuum, protective atmosphere, or transparent cooling liquid.

The invention relates to a method of manufacturing a body comprising a junction between at least two interconnected portions of the body of different materials, particularly a semiconductor body or a semiconductor device comprising a semiconductor body having a junction between two different materials. The invention furthermore relates to the body or the semiconductor body or semiconductor device produced by said method.

There is often involved the problem of interconnecting two materials through a fairly abrupt junction, particularly in semiconductors in which by interconnecting two semiconductor materials of different energy gaps junctions, so-called heterojunctions can be obtained, which have certain favourable rectifying or photo-electrical effects.

It has been proposed to weld together two or more semiconductor monocrystals of different conductivity types by passing an electric current through them, but in practice this method was found to have such disadvantages as compared with other methods that it has not been launched in practice. Moreover, the use thereof is restricted to bodies having a restricted range of electrical conductivity.

More recently, other methods have been proposed in which the junction is obtained by causing the other material to grow on a substrate of the one material either from the vapour phase or by fusing the material of the lower melting point. These methods have the disadvantage that for the formation of the junction and the connection the material on one side of the junction has to be formed on the other material completely from the vapour phase or from the melt, while frequently the monocrystalline form is required; this is often a time-consuming process, the control of which may be difficult. Moreover, it is mostly necessary for the material of the substrate to be heated at higher temperatures for a long time.

The invention has for its object inter alia, to provide a simple method in which the aforesaid drawbacks or restrictions are considerably mitigated.

The invention is based inter alia, on the recognition of the fact that the materials to be interconnected often have considerably different absorption constants for electromagnetic radiation, for example, like frequently in semiconductors, owing to the difference between energy gaps, and that this may be utilized by directing electromagnetic radiation through the material of the lower absorption to the interface between the materials, so that by selective absorption in the material of the higher absorption constant in the immediate vicinity of the interface the conditions, that is to say, rise in temperature, increase in pressure and/or strong, local electromagnetic fields can be obtained, which are capable of establishing the desired junction and connection.

Therefore, in a method of manufacturing a body comprising a junction between at least two interconnected portions of the body of different materials, particularly of manufacturing a semiconductor body or a semiconductor device comprising a semiconductor body having a junction between two different materials, a first portion of the one material is, in accordance with the invention, brought into contact with a second portion of a different material having a considerably greater absorption constant for electromagnetic radiation in a given frequency range, while electromagnetic radiation of such a frequency range that it is absorbed by the other material to a considerably greater extent is incident via the portion having the lower absorption constant, on the interface between the two portions, so that by substantially selective absorption in the other material near the interface a connection and a junction are established between the two portions by only local fusion of the portions near the interface. An important advantage of the invention therefore resides in that it enables in a simple manner to produce the energy transfer predominantly at the place where the connection and the junction are desired, that is to say at the interface.

According as the difference between the absorption constants is greater, the better is the selective absorption and local fusion near the interface, while the direct heating can be restricted to a small distance from the interface. It should be noted here that the absorption constant of a material is to denote here, as usual, the reciprocal value of the distance over which the intensity of radiation incident on the surface of the material has dropped owing to absorption in the material below the surface to $1/e$ of its value at the surface ($e$ is the base of the natural logarithms). It is known that this absorption constant for a given material is often intimately dependent upon the wavelength of the radiation.

In a preferred embodiment of the invention, a directional beam of electromagnetic radiation emanating from an optical maser, also termed laser (as described in Electronic Technology, vol. 39, No. 3, pages 86–94, March 1962), is used for this purpose. The use of a laser has inter alia, the advantage that the intensity of the radiation produced may be high and the duration of the pulse can be adjusted so that the transfer of energy, for example for heating, during a very short time is obtainable with the advantages involved (little diffusion and/or evaporation). This result is due to the strong directional effect of the laser radiation, which may, in addition, be focused optically. Moreover, in general, the laser radiation is restricted to a very narrow frequency range so that with a suitable choice of materials and laser the radiation produced can be utilized substantially fully.

The minimum or optimum difference in absorption constants depends upon different factors, which may vary with circumstances, for example, with the technological properties of the materials to be interconnected, for instance the melting point of the material having the higher absorption constant, the temperature and pressure at which the two materials alloy with each other, the permissible temperature of the materials, for example in view of the volatility of one material or of both, or in view of unwanted disturbance of given, for instance electrical, properties of the materials, the thickness of the portion of the material having the lower absorption constant, the requirements to be met by the junction and the connection, and the method of radiation, that is to say the wavelength, the duration of the radiation pulse and the intensity of the radiation during the pulse. In general, the period of radiation wil be chosen as short as possible in order to minimize heat development due to absorption in and heat conduction from the place concerned to further parts.

It should be noted here that the laser technique provides a great variety of lasers having different periods of radiation, different radiation intensities and wavelengths. There are for example continuously operating lasers, pulse lasers and so-called giant pulse lasers; in the latter an active laser medium is charged for some time with radiation energy, which is given off subsequently in a short pulse of high intensity. The giant pulse laser may be particularly important for the invention under certain conditions.

In view of the aforesaid factors the technician can choose the radiation conditions for a given case in a simple manner so that the desired connection or junction is obtained by local fusion near the interface, if at least the materials to be interconnected have a considerable difference in absorption constants. The permissible minimum difference therefore depends upon the given conditions; preferably the difference is maximum, but in practice the difference in absorption constants will, in general, be a factor 10 at the least and preferably a factor 100 at the least.

In connection with the foregoing it will furthermore be evident that in a given case the portion of the body having the lower absorption constant, through which the radiation is incident, may have a larger thickness than the portion having the higher absorption constant. The term thickness is to denote here the dimension of a portion in a direction at right angles to the interface.

The invention may be particularly advantageous for the establishment of so-called hetero-junctions between two semiconductors having different energy gaps. A first portion of one material having a given energy gap is caused to contact with a second portion of a further material having a smaller energy gap and having consequently a considerably higher absorption constant for electromagnetic radiation in a frequency range in which the photon energy is at the most equal to that which corresponds to the larger energy gap and is higher than that which corresponds to the smaller energy gap, while via the material having the larger energy gap the electromagnetic radiation is incident on the interface, said radiation having mainly a photon energy which is at the most equal to that which corresponds to the larger energy gap, said radiation having at least for a considerable part a photon energy which corresponds to the aforesaid frequency range.

The aforesaid limits of the frequency range are determined by the fact that, apart from any absorption due to impurities in a semiconductor, particularly that radiation can be absorbed the photon energy of which exceeds the energy corresponding to the energy gap. Although it is in practice preferred to use only a radiation the photon energy of which lies within said frequency range, since the radiation employed can then be substantially fully utilized in the sense of the invention, there may be used a radiation, part of which has a photon energy which is lower than the smaller energy gap (so that it is not absorbed by either portion), provided a considerable part lies within said frequency range.

Although the absorption between the valence band and the conduction band, as stated above, is to be preferred owing to its high effectiveness, use may be made, under certain conditions, in addition, of the absorption through energy levels lying in the forbidden energy gap and due to impurities. If desired, the presence of these impurities and the corresponding energy levels might be utilized in the sense of the invention, for example, for interconnecting two portions of the same semiconductor basic material, one portion containing a small quantity and the other portion containing a great quantity of active impurities, so that the difference in absorption is great.

It will furthermore be obvious that this preferred form of the method according to the invention may be used not only for establishing hetero-junctions between semiconductor materials but also for connecting for example a metal with a semiconductor, provided the semiconductor has a low absorption and the metal a comparatively high absorption for the relevant radiation incident upon the semiconductor.

It should be noted here that, although lasers have already been employed for welding, the use concerned was invariably never based on the difference in absorption between the materials to be interconnected according to the invention. Moreover, since the radiation is incident on a material having a high absorption, no direct, selective heating and local fusion is obtained at the interface; particularly the surface is then exposed to the heating effect, so that particularly if the interface lies at a greater depth beneath the surface than the depth of penetration of the radiation, a rise in temperature did not appear or appeared only scarcely by direct heating at the interface.

A further advantage of the method consists in that it may be carried out while the portions to be interconnected are in surroundings of different kind, while it is only required for said surroundings to be substantially transparent for the radiation concerned. The surrounding may be chosen so that they are conducive to the effect.

The two portions may, for example, be in vacuo at least during the irradiation. It is thus possible to establish a connection between two surfaces of a high degree of purity.

During the irradiation the two portions may be in a protective or purifying ambiance, which is substantially transparent to the radiation concerned. If, for example, an etching gas or an etching liquid is used, it can be ensured that the contacting surfaces are purified at the instant when the connection is established. If desired, the connection may be established in a gas of such composition that for example evaporation of one or more volatile constituents of the portions to be interconnected is counteracted.

As a further alternative the portions may be interconnected while they are located in a transparent cooling liquid, which conducts away redundant heat. A further advantage of the use of a suitable coolant may consist in that in certain cases an improved matching of the crystal lattices is obtained, since the expansion coefficient is a function of temperature, so that a temperature of maximum order can be found. The method may furthermore be useful for establishing a connection between materials which are unstable at the temperature of the treatment, for example cubic tin.

The method according to the invention will now be described with reference to an example, in which it is used for establishing a hetero-junction between two semiconductors having different energy gaps.

The figure shows diagrammatically a device with the aid of which the method according to the invention can be carried out.

Referring to the figure, reference numeral 1 designates a semiconductor wafer, for example, of germanium having an energy gap of $\approx$0.7 ev., which is brought into contact with a semiconductor wafer 2, for example, of cadmium sulphide, having an energy gap of $\approx$2.4 ev. The contact surfaces of the two wafers may be prepared, if desired, in a given manner (polished, etched), and are preferably monocrystalline with the same orientation in order to obtain an optimum matching of the crystal lattices. A beam of radiation 4, which may be focused by means of an optical system 5, is caused to strike the joined wafers, said radiation being preferably produced by a known laser, for example, in this case a ruby laser 6 having a wavelength of about 6900 A. This corresponds to a photon energy of about 1.8 ev., which is located, in accordance with the foregoing, between the energy gaps of Ge and CdS.

For light of wavelengths of about 7000 A. the absorption constant of Ge is about $10^4$ cm.$^{-1}$ and that of Cds about 2.7 cm.$^{-1}$. The duration of the radiation pulse may vary for example between 1 and 100/$\mu$sec. and it depends upon the intensity. In certain cases longer durations of radiation on a lower level may be used with the aid of continuously operating lasers. By a suitable choice of said duration and of the intensity a selective energy absorption is obtained in the wafer 1 near the interface 3 with the result that the temperature or the pressure is raised and/or electromagnetic fields exert an influence so that locally a fusion of the wafers 1 and 2 is obtained near the interface 3, the connection and the junction being obtained subsequent to cooling. It will be obvious that, if the wafer 2 is thicker than the wafer 1, it may nevertheless be advantageous in accordance with the invention to cause the radiation to strike first the thicker wafer.

By focusing to a greater or lesser extent and by moving the wafers relatively to the beam of radiation it can be ensured that the adhesion is obtained at a number of places and in a predetermined zone. The wafers may, for example, be welded together at a number of places so that afterwards the wafers can be separated, for example by sawing or by other means, into a number of separate semiconductor bodies.

The whole assembly or only the part outlined by the line 8 may be arranged in a chosen ambiance which is transparent for the radiation concerned in accordance with the possibilities described above. In order to reduce impurities the ambiance may be a vacuum. In other cases, in which oxidation and/or impurities will not be a source of trouble, the connection may be established in air. In accordance with the foregoing the wafers 1 and 2 may be pressed against each other with a greater or smaller force in order to vary the temperature of fusion or to facilitate the connection.

By this method connections have been established between different semiconductors, inter alia between CdS and Ge, which connections exhibited rectifying properties.

It will be obvious that the method according to the invention is not restricted to the example given above. The wafer 1 may be of an absorbing material not being a semiconductor, for example of a metal, while the wafer 2 is of a substance pervious to the radiation concerned. Other semiconductor materials may be interconnected by this method, for example Ge and GaAs, having energy gaps of $\approx$0.7 ev. and $\approx$1.4 ev. respectively, it being then required to use a laser operating in the infrared between about 9000 A. and 18,600 A. Under given conditions it may be found to be useful to preheat homogeneously the portions to be interconnected by conventional means at a temperature lying below the temperature of fusion, after which the connection is established by using the method according to the invention.

What is claimed is:

1. A method of bonding together by interfacial fusion first and second body portions of different materials, said first body portion having a relatively high absorption constant for electromagnetic radiation in a narrow spectral range, said second body portion having a relatively lower absorption constant for the same electromagnetic radiation in the same narrow spectral range in comparison with that of the first body portion, comprising the steps:

(a) placing in contact with one another along a common interface the said first and second body portions;

(b) generating electromagnetic radiation in said narrow spectral range;

(c) and directing said electromagnetic radiation to impinge on a surface portion remote from the interface of said second body portion to pass through said second body portion of low absorption onto the said interface and the said first body portion of high absorption causing absorption to take place in the latter near the interface and increasing its temperature until local fusion of the said irradiated body portions at the interface occurs.

2. A method as set forth in claim 1 wherein the electromagnetic radiation is generated by a laser.

3. A method as set forth in claim 1 wherein the absorption constants of the first and second body portions differ by a factor of at least 100.

4. A method as set forth in claim 1 wherein the first body portion is of semiconductive material having a given energy gap between its valence and conduction bands, the second body portion is of semiconductive material having a larger energy gap between its valence and conduction bands, and the radiation used has a spectral range corresponding to an energy value which is at the most equal to the larger energy gap and higher than the said given energy gap.

5. A method as set forth in claim 4 wherein the spectral range corresponds to energy values falling completely between the given and larger energy gaps.

6. A method as set forth in claim 5 wherein the first and second body portions are semiconductor monocrystals.

7. A method as set forth in claim 1 wherein the said second body portion is thicker than the first body portion.

8. A method as set forth in claim 1 wherein the first and second body portions are arranged in vacuum during the time that it is irradiated.

9. A method as set forth in claim 1 wherein the first and second body portions are arranged in a protective atmosphere during the time that it is irradiated.

10. A method as set forth in claim 1 wherein the first and second body portions are arranged in a transparent cooling liquid during the time that it is irradiated.

References Cited

UNITED STATES PATENTS

| | | | |
|---|---|---|---|
| 2,743,201 | 4/1956 | Johnson et al. | 29—576 |
| 3,229,095 | 1/1966 | Lasher et al. | 219—121 |
| 3,265,855 | 8/1966 | Norton | 219—121 |
| 3,304,403 | 2/1967 | Harper | 219—121 |
| 3,369,101 | 2/1968 | Di Curcio | 219—121 |

OTHER REFERENCES

"The Laser, a Tool," Metal Progress, November 1962, pp. 66–69, By R. D. Engquist.

RICHARD M. WOOD, *Primary Examiner.*

W. D. BROOKS, *Assistant Examiner.*